United States Patent [19]

Manning

[11] Patent Number: 5,552,743
[45] Date of Patent: Sep. 3, 1996

[54] THIN FILM TRANSISTOR REDUNDANCY STRUCTURE

[75] Inventor: Monte Manning, Kuna, Id.

[73] Assignee: Micron Technology, Inc., Boise, Id.

[21] Appl. No.: 313,627

[22] Filed: Sep. 27, 1994

[51] Int. Cl.⁶ .............................. G11C 17/16; G11C 7/00
[52] U.S. Cl. .................... 327/567; 327/518; 327/520; 327/525; 327/526; 327/581
[58] Field of Search .................................. 365/200, 201, 365/225.7, 96; 327/567, 518, 520, 525, 526, 581

[56] References Cited

U.S. PATENT DOCUMENTS

| | | | |
|---|---|---|---|
| 5,038,368 | 8/1991 | Lee | 377/28 |
| 5,056,061 | 10/1991 | Akylas et al. | 365/96 |
| 5,299,151 | 3/1994 | Ishihara et al. | 365/96 |
| 5,299,152 | 3/1994 | Ishihara et al. | 365/96 |
| 5,309,394 | 5/1994 | Wuertz et al. | 365/189.03 |
| 5,319,592 | 6/1994 | Nguyen | 365/225.7 |
| 5,392,245 | 2/1995 | Manning | 365/200 |

Primary Examiner—Viet Q. Nguyen

[57] ABSTRACT

In a microcircuit device such as a memory chip, where a bank of state devices such as fuses and anti-fuses determine the enabling and disabling of redundant circuitry, a scheme for blowing one or more state devices by applying a programming voltage through a switching circuit comprising thin film transistors (TFTs) which are not damaged by the device blowing, programming voltage. The TFTs can be activated by a low voltage enable signal provided by a state device designator logic module.

15 Claims, 6 Drawing Sheets

*Fig. 1*

*(PRIOR ART)*

THIN FILM TRANSISTOR REDUNDANCY STRUCTURE

This invention was made with Government Support under Contract No. MDA972-92-C-0054 awarded by Advanced Research Projects Agency (ARPA). The Government has certain rights in this invention.

FIELD OF THE INVENTION

This invention relates to semiconductor integrated circuits and, more specifically, to the use of state devices such as fuses and anti-fuses to disable a defective portion or block of an integrated circuit and enable a redundant block.

BACKGROUND OF THE INVENTION

Semiconductor integrated circuits contain large numbers of electronic components such as capacitors, diodes, resistors and transistors built on a single chip. Due to the microscopic scale of these circuits, they are susceptible to component defects caused by material impurities and fabrication hazards.

In order to circumvent this problem, chips are built with redundant components and/or circuits that can be switched-in in lieu of corresponding circuits found defective during testing. Usually the switching-out of a defective component or circuit and the switching-in of a corresponding redundant component or circuit is accomplished by using program logic circuits which are activated by altering or programming certain state devices such as fuses or anti-fuses built into the chip circuitry. The process of altering or programming a subset of the available fuses or anti-fuses in order to switch-in the redundant circuitry is also known collectively as programming or repairing.

Figure 1:
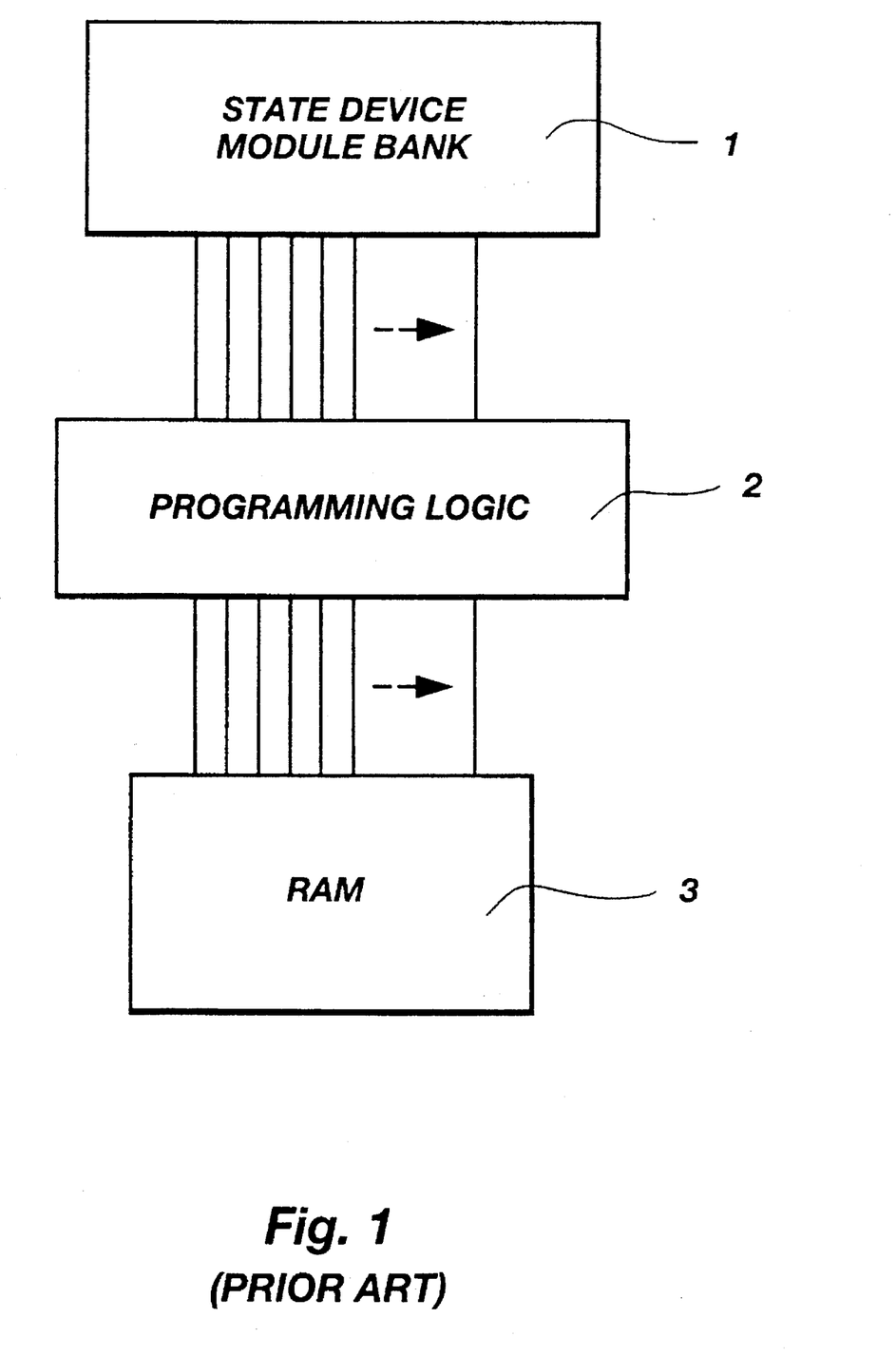
FIG. 1 is a prior art block diagram of a typical memory redundancy scheme.

FIG. 1 illustrates a typical prior art structure for programming a random access memory (RAM) type integrated circuit (IC). The structure involves a bank 1 of state device modules which controls the programming logic circuitry 2, which actually makes the switch between defective and redundant circuit portions in the RAM array 3 based on the output of the state device memory bank 1. The bank contains a number of state device circuit modules. Each module contains at least one state device.

State devices are conductivity alterable components. They are manufactured in an initial state, either open (very low conductivity) or closed (high conductivity), and can be altered or programmed to assume the opposite state. Normally, this alteration is only one way, i.e. an altered device cannot be returned to its previous state. Fuses are manufactured closed and are blown open by applying a sufficient current through the device such that resistive heating causes the normally conductive fuse element to melt or explode, thereby forming an open circuit. Anti-fuses such as dielectric capacitors are manufactured open and are blown or programmed to the closed state by applying a sufficient voltage above their breakdown voltage across their terminals. At this voltage the dielectric layer separating the conductive plates of the capacitor ceases to be electrically insulating. The capacitor then permanently forms a closed circuit between its two terminals.

Figure 2:
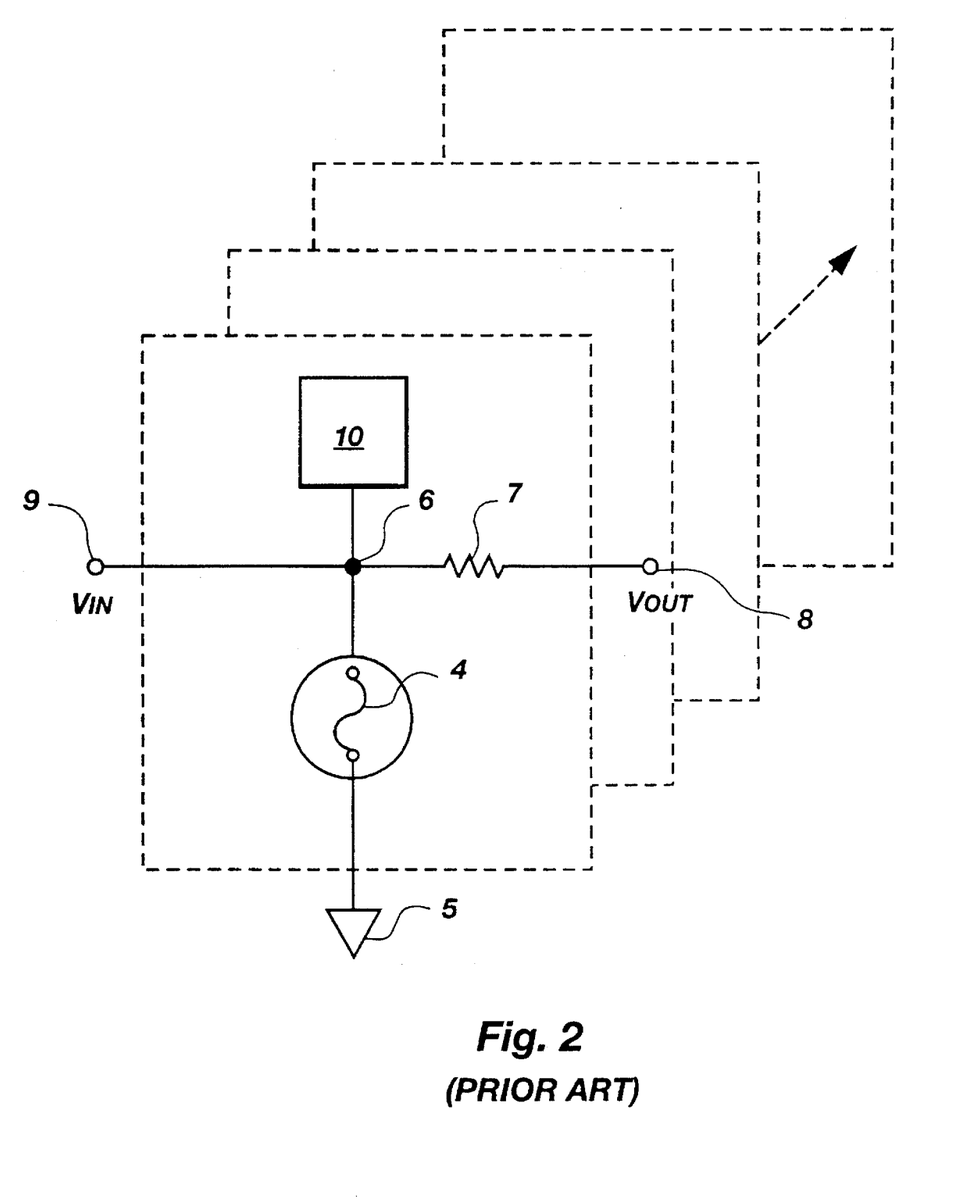
FIG. 2 illustrates a prior art bank of state device module circuits.

Although many different state device module circuit designs are possible, each must perform two basic functions: First, altering the state device without subjecting the programming logic circuitry to the programming voltage or current, and second, communicating the state of the fuse or anti-fuse to the programming logic circuitry. FIG. 2 shows a simplified state device module circuit containing one fuse-type state device, a fuse 4 which is connected to ground 5 and a node 6. The node is connected through a resistor 7 to output terminal $V_{out}$ 8. The node is also connected to terminal $V_{in}$ 9 and a conductive pad 10.

During programming, a high voltage $V_{bd}$ is applied to the pad using a probe. The current produced by this voltage causes the fuse to blow, creating an open circuit. $V_{out}$ is protected from $V_{bd}$ by resistor 7. After programming is complete, $V_{bd}$ is removed from the pad.

During operation, $V_{cc}$ is applied to the $V_{in}$ terminal. If the fuse is open, $V_{out}$ will show a positive voltage as seen through the resistor. If the fuse is closed, $V_{out}$ will show ground.

Other circuitry may be provided to limit the current through the fuse during operation. In the circuit of FIG. 2, when the fuse is not blown, a direct path exists from $V_{in}$ to ground. In the simplest case, a resistor or some other current limiting device placed between the node 6 and $V_{in}$ would provide this function.

Typically, the voltage required to alter a fuse or other state device is high enough to damage the transistors and capacitors which make up much of the programming logic circuitry and memory arrays on a typical integrated circuit microchip. The high voltage cannot be multiplexed through other circuitry since it would damage the circuitry typically used for this purpose. In order to protect this circuitry, each state device is given a dedicated pad as a point where the high voltage can be exclusively applied, thus avoiding application of this voltage to the sensitive circuits. Since the pads must be large enough to be engaged by a probe, they take up a substantial portion of the available space on each microchip. This limits the number of pads and state devices. In turn, chip designers have devised elaborate schemes and structures to offer the maximum redundancy with the minimum number of state devices.

In addition, it is difficult to develop redundancy structures whereby a single state device in a bank of state devices may be selectively altered using logic circuitry. The problem here is that the transistors and other devices used to make up the logic circuitry are themselves susceptible to failure when directing voltages and currents high enough to alter the state device.

Because of the use of dedicated altering pads, the current prior art solution requires programming prior to packaging. Since the programming pads are covered with passivation prior to assembly, any switch to redundant circuitry must occur before burn-in and thus, delivery to the customer. Currently, failures detected during and after burn-in result in the entire chip being scrapped.

It would be desirable, therefore, to have a state device module which is capable of receiving a low voltage programming signal which allows high voltage to alter the state device without that high voltage being carried through to other circuitry on the chip, both during and after the programming voltage is applied. It is also desirable to be able to perform this programming before and/or after packaging the integrated circuit.

SUMMARY OF THE INVENTION

The principal and secondary objects of this invention are to provide a structure whereby sensitive microcircuit components may be protected from incompatible voltages required by an element in the microcircuitry. It is a further object of this invention to provide a structure that requires fewer pads on an integrated circuit chip solely dedicated to altering or programming a finite number of state devices. It is another object of this invention to create a structure whereby the state devices may be altered before and/or after burn-in, packaging and delivery to the customer.

These and other objects are achieved by adding a state device designator logic module which selectively sends an enable signal to those state device modules having a state device to be altered. Each state device module, in turn, uses switching devices such as thin film transistors (TFTs) capable of withstanding high voltages to apply the high programming voltage or current to the state device element while protecting downstream circuitry to which the module is connected.

A TFT is a form of a field effect transistor having a control gate and two current carrying terminals, namely a source and a drain. TFT gate dielectrics are typically thicker than bulk MOS gate dielectrics, and can therefore withstand the high programming voltage.

DESCRIPTION OF THE PREFERRED
EMBODIMENT OF THE INVENTION

Figure 3:
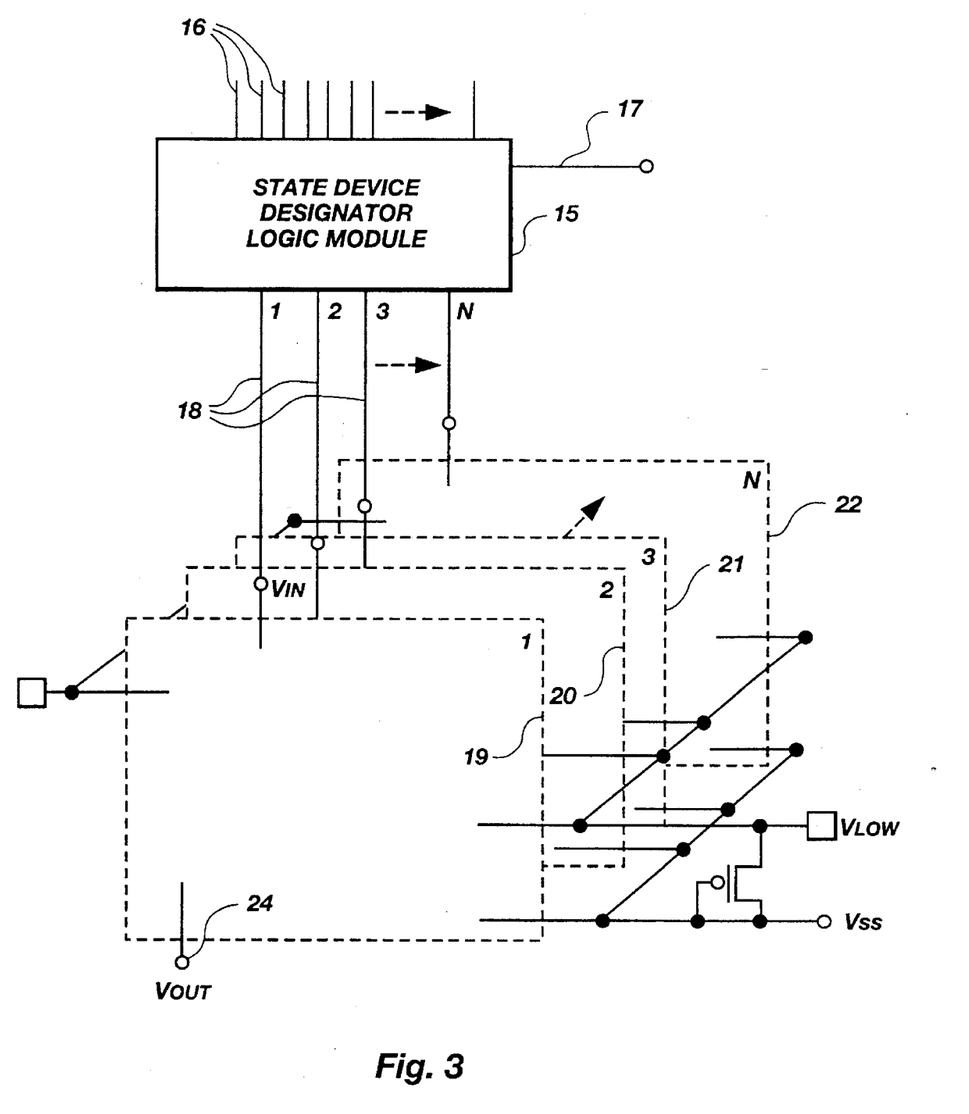
FIG. 3 illustrates a bank of state device modules connected to a state device designator logic module according to the invention.

Referring now to the drawing, there is shown in FIG. 3 a state device designator logic module 15 which uses as its input address lines 16 carrying voltage levels corresponding to memory locations on a memory array. When programming is enabled by a particular value on the programing enable line 17, the particular address arriving on the address lines is interpreted by bulk CMOS logic within the state device designator module to select one of N input lines 18 for programming. Each input line is connected to one of N state device modules 19, 20, 21 and 22. Each state device module contains a circuit which comprises at least one element which is a state device. In this embodiment, the element is a bulk CMOS capacitor (23 in FIG. 4). The additional circuitry in each state device module serves to allow for altering or programming the capacitor without subjecting the output terminal $V_{out}$ 24 to the high programming voltage. This additional circuitry is comprised of switching elements which are not susceptible to damage at the applied programming voltage. One type of circuit element that satisfies this condition is thin film transistors, which are typically used as load elements in SRAM memory cells.

Since $V_{out}$ is wired to other sensitive microcircuit components, $V_{out}$ must be isolated from voltages such as the programming voltage, which are incompatible with those components. Incompatible voltages would be those greater than the dielectric breakdown voltages of the components.

The circuitry in each state device module must also protect the capacitor from the programming voltage if it is not to be programmed. Finally, the circuitry must be able to sense the state of the capacitor during normal operation of the IC and to supply that information via a signal on $V_{out}$.

Figure 4:
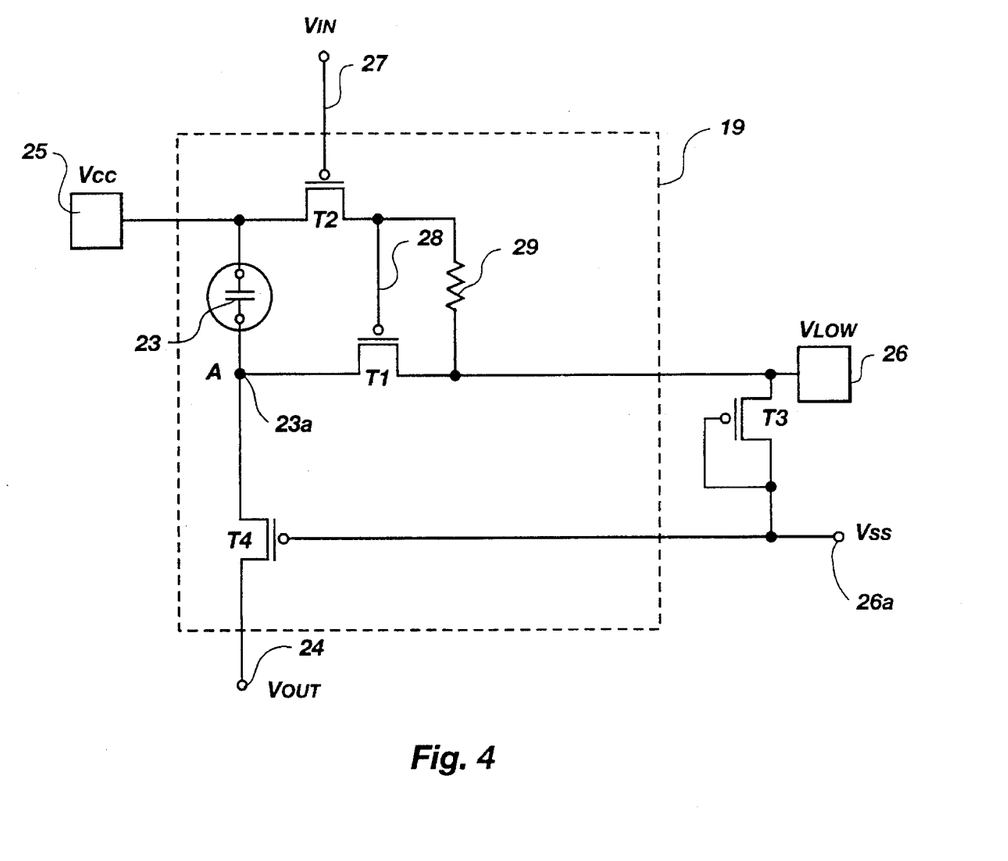
FIG. 4 illustrates a state device module circuit according to the invention.

FIG. 4 shows the circuitry of a single state device module 19. During programming, a first supply voltage input terminal $V_{cc}$ 25 is held at a high voltage which is typically +5 volts, while a second supply voltage input terminal 26 is held at −15 to −20 volts. $V_{low}$ is therefore opposite in polarity to that of $V_{cc}$. Each of these voltages can be supplied by a single pad or pin servicing the entire IC. The program enable input terminal $V_{in}$ 27 is biased high at +5 volts, which turns off thin film transistor $T_2$. This in turn brings the gate 28 of $T_1$ low (−15 to −20 volts) through resistor 29, the other side of which is tied to $V_{low}$ 26. With its gate low, $T_1$ is turned on, pulling node A 23a to the $V_{low}$ voltage. A bulk CMOS capacitor 23 with a dielectric thickness of around 110 angstroms can only withstand about 12 to 15 volts before breaking down. The bulk CMOS capacitor is used in order to simplify processing, since the capacitor can be formed at the same time as other bulk devices. The capacitor dielectric would then be the same thickness as gate dielectric layers used by the bulk devices. With the differential voltage ($V_{cc}$−$V_{low}$) of 20 to 25 volts placed across its terminals, the capacitor quickly blows, forming a closed circuit between $V_{cc}$ and node A. This differential voltage fulfills the role of a programing voltage. When programming is complete, $V_{low}$ is released and $V_{in}$ remains forced high to +5 volts by the state device designator to keep $T_2$ turned off. $T_1$ remains on but the conductance of the blown capacitor is higher than or comparable to that of $T_1$. Therefore, node A is pulled towards $V_{cc}$.

Since the voltage at node A is between $V_{cc}$ and $V_{ss}$, $T_4$ has a non-zero voltage applied across its source and drain terminals. The gate of $T_4$ is tied to $V_{ss}$, turning $T_4$ on, which pulls $V_{out}$ 24 toward $V_{cc}$ along with node A. $V_{out}$ is used by the programming logic (2 in FIG. 1) to effect repairing of the IC.

To prevent the capacitor from being blown during programming of other modules, when $V_{low}$ is held at −15 to −20 volts, $V_{in}$ is merely biased low at 0 volts. In this case, $T_2$ is on, allowing the gate 28 of $T_1$ to be pulled high through $T_2$ to +5 volts appearing on $V_{cc}$. This keeps $T_1$ shut off, isolating the capacitor 23 from $V_{low}$. Again, when programming is complete, $V_{low}$ is released and $V_{in}$ is forced high to +5 volts. This turns off $T_2$. The gate 28 of $T_1$ is pulled low to the voltage appearing on the terminal $V_{ss}$ 26a through the resistor 29 and $T_3$, thereby turning $T_1$ on. Since the capacitor is intact and does not conduct current at 5 volts, node A is pulled toward $V_{ss}$ through $T_1$ and $T_3$. In this circuit, $T_3$ has its gate wired to its drain to form the cathode of a TFT diode which is backwired (cathode to minus and anode to plus) between $V_{ss}$ and $V_{low}$.

$T_4$ acts as an isolation element to prevent the voltage on $V_{low}$ from reaching $V_{out}$ 24 during programming, thereby protecting the bulk MOS devices in the programming logic (2 in FIG. 1). $T_4$'s gate is wired to $V_{ss}$. When the state device module is selected by the designator to blow the capacitor, node A 23a is pulled to $V_{low}$ as previously described. Once node A is equal to or less than the gate potential of $T_4$ ($V_{ss}$), $T_4$ turns off, thereby protecting the bulk device, wired to $V_{out}$ from node A and hence, $V_{low}$. Once $V_{low}$ is released and normal, "sensing" operation of the circuit resumes, and node A is either pulled towards $V_{cc}$ or $V_{ss}$, depending on whether the capacitor is intact or not. In either case, since the gate of $T_4$ is biased at $V_{ss}$, $T_4$ is on and passes the voltage on node A to $V_{out}$ and subsequent circuitry. Therefore, the voltage appearing on $V_{ss}$ is, in essence, an element status interrogating signal.

In this embodiment, TFTs are used as the circuit elements in the state device module. TFTs typically provide a low amount of current when turned off. This current is insufficient to cause breakdown of bulk gate dielectrics, but is sufficient to pass a voltage if no higher current source is provided. Therefore, when node A and $T_4$'s gate are both at $V_{ss}$, $V_{out}$ will eventually be pulled completely to $V_{ss}$ as well. The circuitry to which $V_{out}$ is connected (in the programming logic circuitry) is typically a bulk device gate terminal, and therefore does not provide a DC source of current that can overcome the "leakage" off current of $T_4$.

Figure 5:
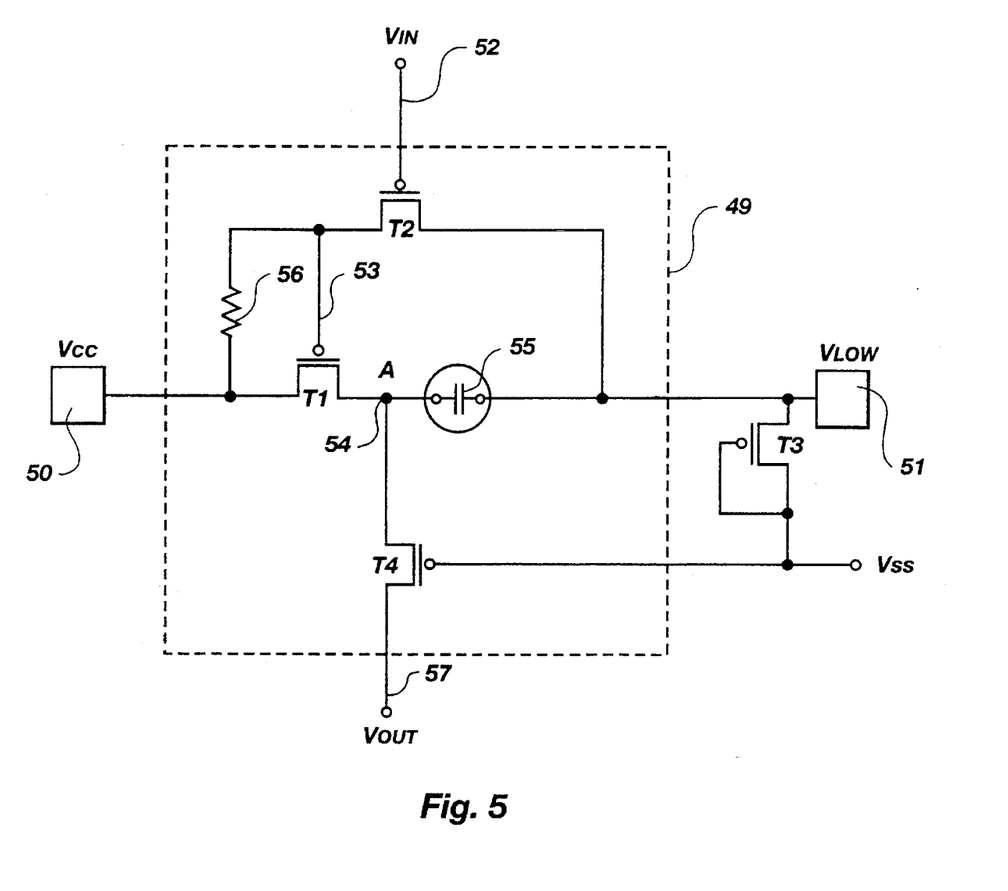
FIG. 5 illustrates an alternate embodiment of a state device module circuit according to the invention.

An alternate embodiment of the state device module circuitry is shown in FIG. 5. Here, the isolating circuitry has shifted to the $V_{cc}$ side of the module 49. As with the previous embodiment, during programming, $V_{cc}$ 50 is held at a high voltage, +5 volts, while $V_{low}$ 51 is held at −15 to −20 volts. However, program enable input line $V_{in}$ 52 is biased low to turn on thin film transistor $T_2$. This brings the gate 53 of $T_1$ low through $T_2$. With its gate low, $T_1$ is turned on, pulling node A 54 to the $V_{cc}$ voltage. This places the differential programming voltage of 20 to 25 volts ($V_{cc}-V_{low}$) across the capacitor 55, which causes it to blow, forming a closed circuit between $V_{low}$ and node A.

To prevent the capacitor from being blown during programming when $V_{low}$ is held at −15 to −20 volts, $V_{in}$ is biased high. This causes $T_2$ to be off, allowing the gate 53 of $T_1$ to be pulled high through the resistor 56, thereby turning $T_1$ off as well. This isolates the capacitor 55 from $V_{cc}$ and keeps it from being blown.

During sensing, $V_{low}$ is released and $V_{in}$ held low, turning on $T_2$. The gate 53 of $T_1$ is pulled to $V_{ss}$ through $T_3$ and $T_2$, thereby turning $T_1$ on. If the capacitor is intact and does not conduct current at 5 volts, node A is pulled to $V_{cc}$ through $T_1$. If the capacitor is blown into a closed circuit, node A is pulled to $V_{ss}$ through $T_3$. Again, $T_4$ acts as an isolation element to prevent the programming voltage from reaching $V_{out}$ 57 and bulk MOS devices connected to $V_{out}$.

The invention allows for a reduction in the number of required pads since each state device module no longer requires a dedicated pad for programming. The separate input to each state device module ($V_{in}$) is in the form of a programming enable line, not a programming pad. The low programming voltage may be applied at a single pad which is wired to $V_{low}$ of all the state device modules. Pads will still be required for $V_{cc}$ and other IC functions such as the addressing pads. However, these pads are required in any case as part of the standard chip configuration. The only additional pad required by the invention is one for $V_{low}$.

Programming may be done in the traditional manner through probe while the individual IC's are still united in a wafer. Or, since programming is done through pads which will be connected to pins when the IC is packaged, programming may be performed after packaging, burn-in or delivery to the customer. In this way, failures after burn-in may now be recovered, reducing scrap.

It shall be understood that the state device designator logic module need not have individual address lines running into it. Addressing data can arrive through other means such as one or more multiplexed signal lines. A programming enable pad may not be necessary if the module is designed to accept an enable message through the address line or lines.

Other state devices may be used such as resistors, polysilicon fuses or other anti-fuse devices such as interpoly capacitors, intermetal capacitors and those using sacrificial interfacial oxides without departing from the invention. Circuitry using these devices can make similar use of TFTs to protect bulk MOS logic circuits from the high programming voltages.

If the invention is implemented on an SRAM chip already using thin film transistors as memory cell load elements, no additional fabrication processing is required since both the load elements and the state device modules can be created during the same fabrication steps. In any integrated circuit which fabricates separate TFTs in other circuitry for purposes other than the redundancy scheme and not part of any means for isolating the programming voltages from more sensitive components on the microcircuit chip, the invention TFTs can be fabricated during those steps which fabricate the separate TFTs.

Figure 6:
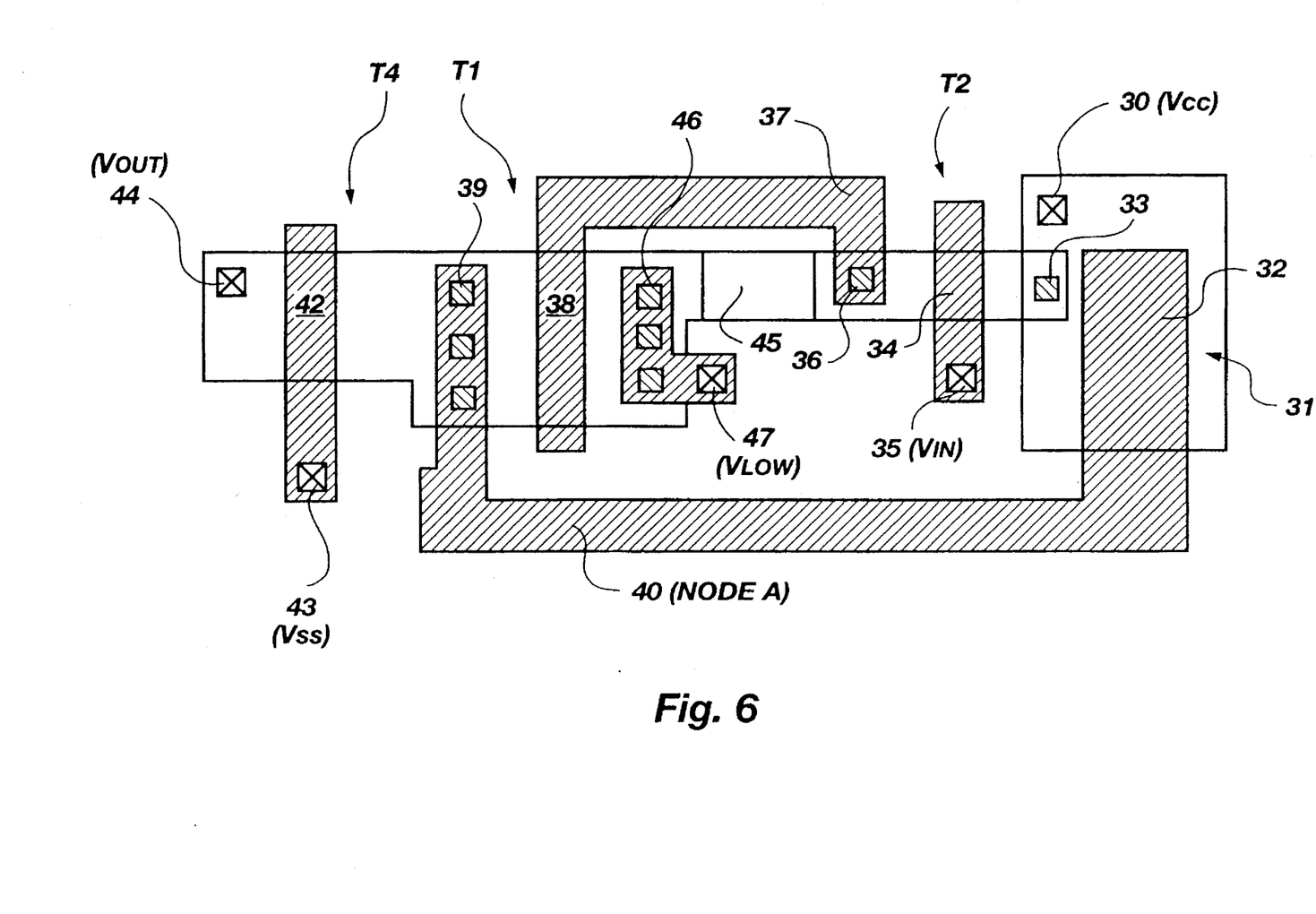
FIG. 6 shows a plan view of a semiconductor layout structure for implementing the circuit of FIG. 3.

An embodiment of an IC structural layout for the fuse module circuitry is shown in FIG. 6. The circuit is formed on an n-well which is wired to $V_{cc}$ 30. The capacitor 31 is formed between the n-well and a conductive polysilicon structure 32 separated from the n-well by a bulk gate oxide layer. A first terminal of the capacitor is wired through the n-well to a first p-type source/drain electrode 33 of a thin film field effect transistor, $T_2$. $T_2$'s gate electrode 34 is a conductive polysilicon structure which is connected to $V_{in}$ through a contact point 35. $T_2$'s second source/drain electrode 36 is wired via a conductive polysilicon structure 37 to the gate electrode 38 of another thin film field effect transistor, $T_1$. $T_1$'s first source/drain electrode 39 is connected via another conductive polysilicon structure 40, forming node A, to the capacitor's second terminal 32. $T_1$'s first source/drain electrode 39 also forms the first source/drain electrode of another TFT, $T_4$. $T_4$'s gate 42 is connected to $V_{ss}$ through a contact 43, and $T_4$'s second source/drain electrode is connected through a contact 44 to $V_{out}$. A high value resistor 45 connects $T_1$'s second source/drain 46 to $T_2$'s second source/drain 36. $T_1$'s second source/drain is also wired to $V_{low}$ through a contact 47.

The layout of FIG. 6 is only one example. Many other structural configurations are available without departing from the invention. In addition, the arrangement and makeup of the circuit elements may be altered without departing from the invention.

While the preferred embodiments of the invention have been described, modifications can be made and other embodiments may be devised without departing from the spirit of the invention and the scope of the appended claims.

What is claimed is:

1. In a microcircuit device wherein a voltage differential is applied to at least one element of said microcircuit device, said voltage differential being incompatible with a plurality of said microcircuit components; means for isolating said components from said voltage differential, which comprise:

at least one first TFT switching circuit adapted to apply said voltage differential to said element; and at least one second TFT switching circuit adapted to separate said components from said voltage differential.

2. The structure of claim 1 which further comprises:

a first supply voltage compatible with said components;

a second supply voltage, wherein said voltage differential is taken between said first and second supply voltages; and wherein said element comprises a state device having a current conductivity alterable by an application of said voltage differential thereacross.

3. The structure of claim 2, wherein said first TFT switching circuit comprises a first TFT switch having a first control gate, said first TFT switch being wired in series with said state device between said first and second supply voltages;

and wherein said second TFT switching circuit comprises:
a second TFT switch having a second control gate wired to a first terminal adapted to receive an element status interrogating signal,
said second TFT switch being wired in series with said state device between said first supply voltage and an output terminal.

4. The structure of claim 3, wherein said second TFT switching circuit further comprises:
a TFT diode back-wired between said second control gate and said second voltage supply.

5. The structure of claim 4, wherein said first TFT switching circuit further comprises a third TFT switch having a third control gate adapted to receive a program enabling signal for said element, wherein said third TFT switch has a first current-carrying terminal connected to said first supply voltage and a second current-carrying terminal connected to said first control gate.

6. The structure of claim 2, wherein said first TFT switching circuit comprises a first TFT switch having a first control gate, said first TFT switch being wired in series with said state device between said first and second supply voltages;

and wherein said second TFT switching circuit comprises:
a second TFT switch having a second control gate wired to a first terminal adapted to receive an element status interrogating signal,
said second TFT switch being wired in series with said state device between said second supply voltage and an output terminal.

7. The structure of claim 6, wherein said second TFT switching circuit further comprises:
a TFT diode back-wired between said second control gate and said second voltage supply.

8. The structure of claim 7, wherein said first TFT switching circuit further comprises a third TFT switch having a third control gate adapted to receive a program enabling signal for said element, wherein said third TFT switch has a second current-carrying terminal connected to said second supply voltage and a first current-carrying terminal connected to said first control gate.

9. The structure of claim 3, wherein said microcircuit device further comprises:
at least one third TFT switching circuit adapted to unidirectionally conduct current between said second control gate and said second supply voltage.

10. The structure of claim 1, wherein said microcircuit device is an SRAM integrated circuit having a memory cell, said memory cell having a load element, said load element being a load TFT, wherein
said first TFT switching circuit comprises a first TFT switch;
said second TFT switching circuit comprises a second TFT switch; and
said first and second TFT switches have been fabricated simultaneously during processing steps required to create said load TFT.

11. The structure of claim 2, wherein said state device is a bulk complimentary metal-oxide-substrate capacitor.

12. The structure of claim 2, wherein said state device is selected from a group consisting of:
resistors;
interpoly capacitors; and
intermetal capacitors.

13. The structure of claim 5, wherein said program enabling signal is produced by a state device designator logic module wired to said third control gate.

14. The structure of claim 13, wherein said state device designator logic module comprises:
means for enabling a programming mode;
means for interpreting memory array addresses corresponding to said element.

15. The structure of claim 6, wherein said microcircuit device further comprises:
at least one third TFT switching circuit adapted to unidirectionally conduct current between said second control gate and said second supply voltage.

* * * * *